United States Patent
Chen et al.

(10) Patent No.: US 7,277,287 B2
(45) Date of Patent: Oct. 2, 2007

(54) HEAT DISSIPATION DEVICE WITH HEAT PIPES

(75) Inventors: Chun-Chi Chen, Tucheng (TW); Shih-Hsun Wung, Tucheng (TW); Guang Yu, Shenzhen (CN); Da-Yuan Zhou, Shenzhen (CN); Jin-Biao Liu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,383

(22) Filed: Mar. 20, 2006

(65) Prior Publication Data

US 2006/0273137 A1 Dec. 7, 2006

(30) Foreign Application Priority Data

Jun. 4, 2005 (CN) .......................... 200510035157

(51) Int. Cl.
*H05K 7/20* (2006.01)
(52) U.S. Cl. ...................... 361/700; 361/699; 361/704; 361/707; 165/80.4; 165/104.33
(58) Field of Classification Search ................ 361/697, 361/700, 704, 707, 709–710, 719–720, 699; 165/80.3, 104.33, 185, 80.4–80.5
See application file for complete search history.

(56) References Cited

U.S. PATENT DOCUMENTS

| | | | |
|---|---|---|---|
| 6,625,021 B1 * | 9/2003 | Lofland et al. ............. | 361/697 |
| 6,779,595 B1 * | 8/2004 | Chiang ................... | 165/104.33 |
| 6,894,900 B2 * | 5/2005 | Malone ...................... | 361/700 |
| 6,917,522 B1 * | 7/2005 | Erturk et al. ................ | 361/700 |
| 6,918,429 B2 | 7/2005 | Lin et al. | |
| 6,945,319 B1 * | 9/2005 | Li et al. ................. | 165/104.33 |
| 6,964,295 B1 * | 11/2005 | Yu et al. ................. | 165/104.33 |
| 7,100,681 B1 * | 9/2006 | Wu et al. ................. | 165/104.33 |
| 7,140,422 B2 * | 11/2006 | Malone et al. ......... | 165/104.33 |
| 7,167,364 B2 * | 1/2007 | Lopatinsky et al. ........ | 361/697 |
| 7,174,951 B1 * | 2/2007 | Lin ....................... | 165/104.33 |
| 7,227,752 B2 * | 6/2007 | Xia et al. ................... | 361/700 |
| 2005/0083660 A1 | 4/2005 | Lee | |
| 2005/0225943 A1 * | 10/2005 | Shih et al. .................. | 361/700 |
| 2006/0104036 A1 * | 5/2006 | Chen et al. ................. | 361/710 |
| 2006/0291166 A1 * | 12/2006 | Cheng ........................ | 361/700 |
| 2007/0029072 A1 * | 2/2007 | Lee et al. .............. | 165/104.33 |

FOREIGN PATENT DOCUMENTS

JP 11351769 A * 12/1999

* cited by examiner

*Primary Examiner*—Jayprakash Gandhi
*Assistant Examiner*—Robert J. Hoffberg
(74) *Attorney, Agent, or Firm*—Jeffrey T. Knapp

(57) ABSTRACT

A heat dissipation device comprises a seat for absorbing heat from a heat generating device. At least a heat pipe has a first section thereof thermally combined to the seat, and two second sections thereof extending from the first section and remotely from the seat. Pluralities of heat sinks are located on the seat. Each of the pluralities of heat sinks has a base and a plurality of fins integrally extending from the base and is made of aluminum extrusion. The bases of the heat sinks thermally sandwich the two second sections of the at least a heat pipe therebetween. At least one of the bases of the heat sinks is angled or perpendicular to the seat.

17 Claims, 5 Drawing Sheets

HEAT DISSIPATION DEVICE WITH HEAT PIPES

FIELD OF THE INVENTION

The present invention relates to a heat dissipation device for use in removing heat from an electronic device, and more particularly to a heat dissipation device incorporating heat pipes for improving heat dissipation capacity thereof.

DESCRIPTION OF RELATED ART

During operation of an electronic device such as a computer central processing unit (CPU), a large amount of heat is often produced. The heat must be quickly removed from the electronic device to prevent it from becoming unstable or being damaged. Typically, a heat dissipation device is attached to an outer surface of the electronic device to absorb heat from the electronic device. The heat absorbed by the heat dissipation device is then dissipated to ambient air.

Conventionally, a heat dissipation device comprises a solid metal base attached on the electronic device, and a plurality of fins arranged on the base. The base is intimately attached on the electronic device thereby absorbing the heat generated by the electronic device. Most of the heat accumulated at the base is transferred firstly to the fins and then dissipated from the fins to ambient air. However, since the electronics technology continues to advance, the amount of heat generated by powerful state-of-the-art electronic devices is enormously increased. Many conventional heat dissipation devices are no longer able to efficiently remove heat from these electronic devices.

In order to overcome the above disadvantages of the heat dissipation device, one type of heat dissipation device used for the electronic device includes a heat pipe which can quickly transfer heat from a position to another position of the heat dissipation device. A heat pipe is a vacuum-sealed pipe that is filled with a phase changeable fluid, usually being a liquid, such as water, alcohol, acetone and so on, and has an inner wall thereof covered with a capillary configuration. As the electronic device heats up, a hot section of the heat pipe, which is usually called an evaporating section and located close to the electronic device, also heats up. The liquid in the evaporating section of the heat pipe evaporates and the resultant vapor reaches a cool section of the heat pipe, which is usually called a condensing section, and condenses therein. Then the condensed liquid flows to the evaporating section along the capillary configuration of the heat pipe. This evaporating/condensing cycle repeats and since the heat pipe transfers heat so efficiently, the evaporating section is kept at or near the same temperature as the condensing section of the heat pipe. Consequentially, heat-transfer capability of the heat dissipation device including such a heat pipe is improved greatly.

Typically, a heat dissipation device illustrated as follows is used widely. The heat dissipation device comprises a base for contacting with a heat generating electronic device, two U-shaped heat pipes each having a first section combined to the base, and a plurality of fins stacked on two second sections perpendicularly extending from two ends of the first section of each heat pipe. Each fin is made by stamping a metal sheet and defines through holes receiving the second sections of the heat pipes therein. Generally, the second sections of the heat pipes are mechanically and thermally secured in the through holes of the fins by soldering. In use, the base of the heat dissipation device contacts the heat generating electronic device and absorbs heat therefrom. The heat in the base is then absorbed by the first sections of the heat pipe, and subsequently reaches the fins via the second sections of the heat pipes; finally, the heat in the fins is dissipated to ambient air. However, each of the fins is made by stamping the metal sheet, and then stacked on the second sections of the heat pipes one by one, which is laborious for manufacture of the heat dissipation device, and results in high cost of the heat dissipation device. Furthermore, the fins contact the heat pipes only in the holes thereof, and thus, contacting area between each fin and the heat pipe is considerably small; what is worse is that the fins can not effectually thermally contact the heat pipe; consequently, the heat in the heat pipes can not duly and adequately reaches the fins to be dissipated. As a result, heat dissipation efficiency of such heat dissipation device is still not good enough to meet functions and abilities of the up-to-date electronic device. Therefore the heat dissipation device needs to be improved.

What is needed, therefore, is a heat dissipation device with heat pipes having improved heat dissipation capability and low cost.

SUMMARY OF INVENTION

A heat dissipation device in accordance with a preferred embodiment of the present invention comprises a seat for absorbing heat from a heat generating device. At least a heat pipe has a first section thereof thermally combined to the seat, and two second sections thereof extending from the first section and remotely from the seat. Pluralities of heat sinks are located on the seat. Each of the pluralities of heat sinks has a base and a plurality of fins integrally extending from the base. The base and the fins are integrally formed as one piece by metal extrusion. The bases of the heat sinks thermally sandwich the two second sections of the at least a heat pipe therebetween. At least one of the bases of the heat sinks is angled or perpendicular to the seat.

Other advantages and novel features will become more apparent from the following detailed description of preferred embodiments when taken in conjunction with the accompanying drawings, in which:

DETAILED DESCRIPTION

Figure 1:
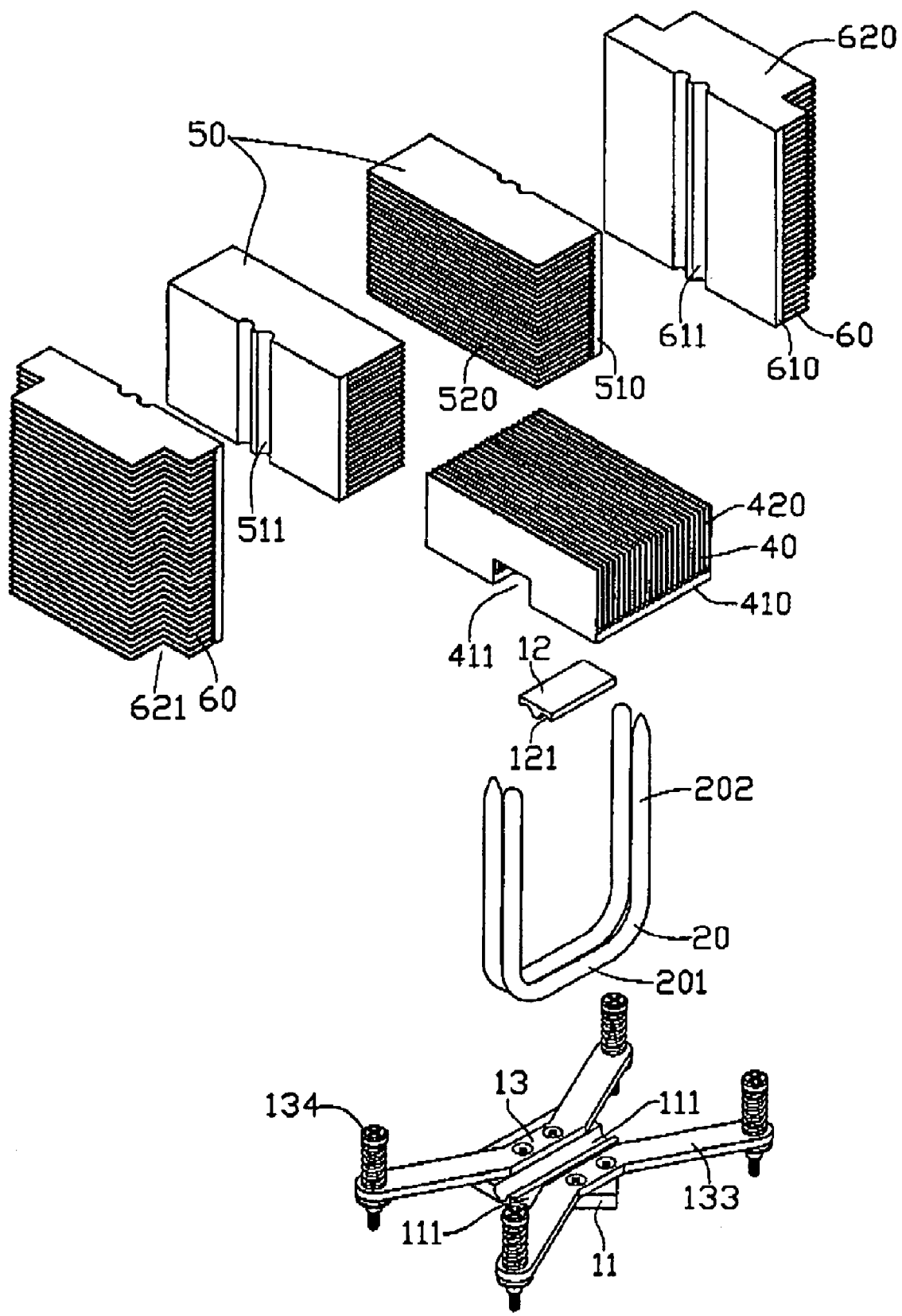
FIG. 1 is an exploded, isometric view of a heat dissipation device in accordance with a preferred embodiment of the present invention.
Figure 2:
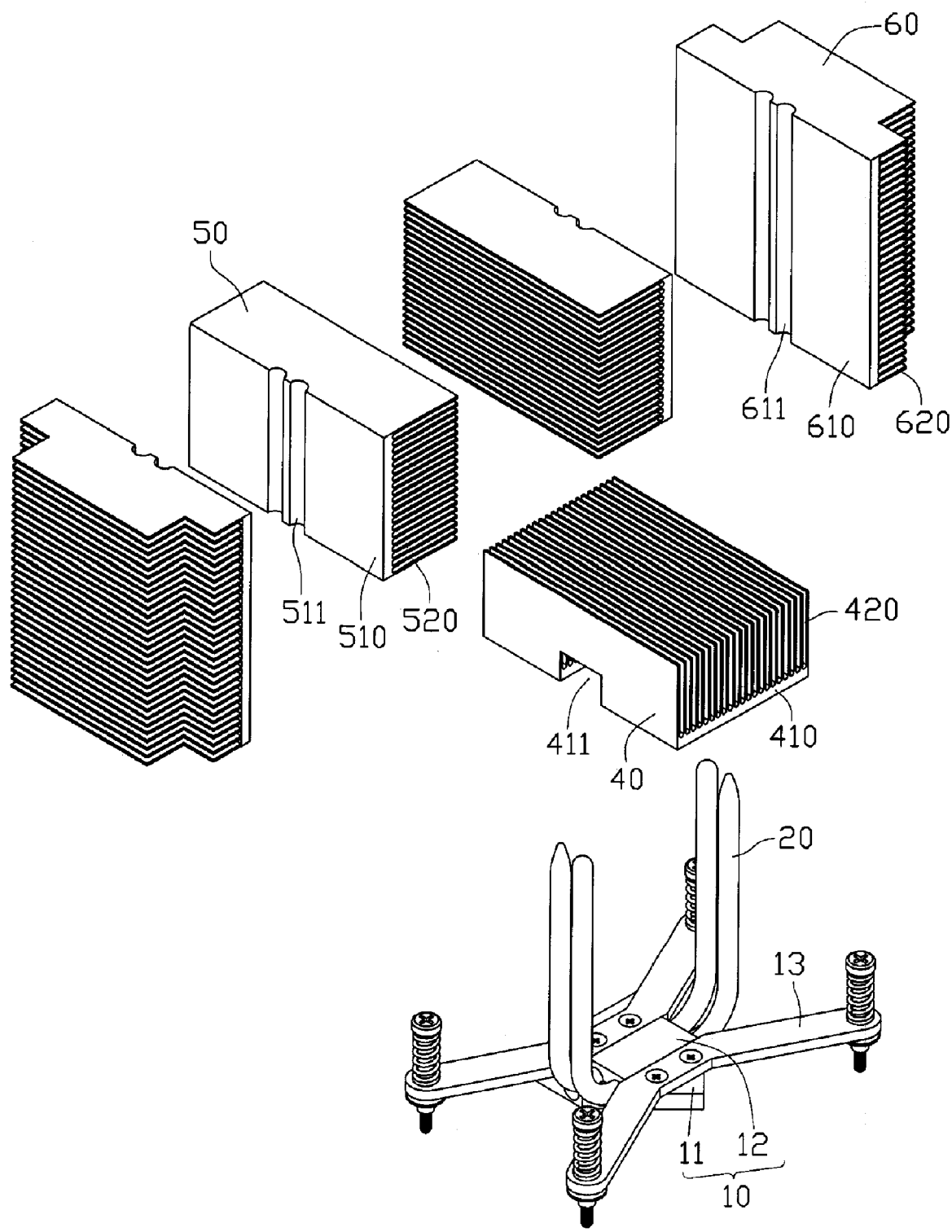
FIG. 2 is a partially assembled view of FIG. 1.

Referring to FIGS. 1 and 2, a heat dissipation device according to a preferred embodiment of the present invention for dissipating heat generated by an electronic device (not shown) located on a printed circuit board (not shown) is shown. The heat dissipation device comprises a seat 10, two heat pipes 20 thermally contacting the seat 10, and a plurality of heat sinks located on the seat 10.

The seat 10 comprises a first base plate 111 and a second base plate 12. Both of the first base plate 111 and the second base plate 12 have great heat conductivity. The first base plate 11 is substantially pentagonal, and has a bottom face for contacting to the electronic device and a top face defining two parallel first grooves 111 therein. The second base plate 12 is substantially rectangular and defines two parallel second grooves 121 corresponding to the first grooves 111 of the first base plate 11. The first and second grooves 111, 121 corporately define two channels (not labeled) for receiving the heat pipes 20 therein. Two fixing members 13 are fixed on the top face of the first plate 11 and located at two opposite sides of the second base plate 12. Each of the fixing members 13 has two fixing arms 133 oppositely extending outwardly away the first base plate 11. Each of the arms 133 defines a fixing hole (not labeled) adjacent a distal end thereof. A fastener 134 such as a screw, bolt or the like is fitted in the fixing hole. A top face of the second base plate 12 and a top face of the fixing member 13 corporately define a plane for arranging the heat sinks thereon.

The two heat pipes 20 are substantially parallel to each other and arranged on the seat 10. Each of the two heat pipes 20 is substantially U-shaped and comprises a first section 201 and two substantially parallel second sections 202 perpendicularly extending from two ends of the first section 201. A round corner is formed at each joint of the first and second sections 201, 202 of each heat pipe 20. The first sections 201 of the two heat pipes 20 are fitted in the channels of the seat 10, respectively. The second sections 202 of the two heat pipes 20 extend perpendicularly away from the seat 10.

Figure 3:
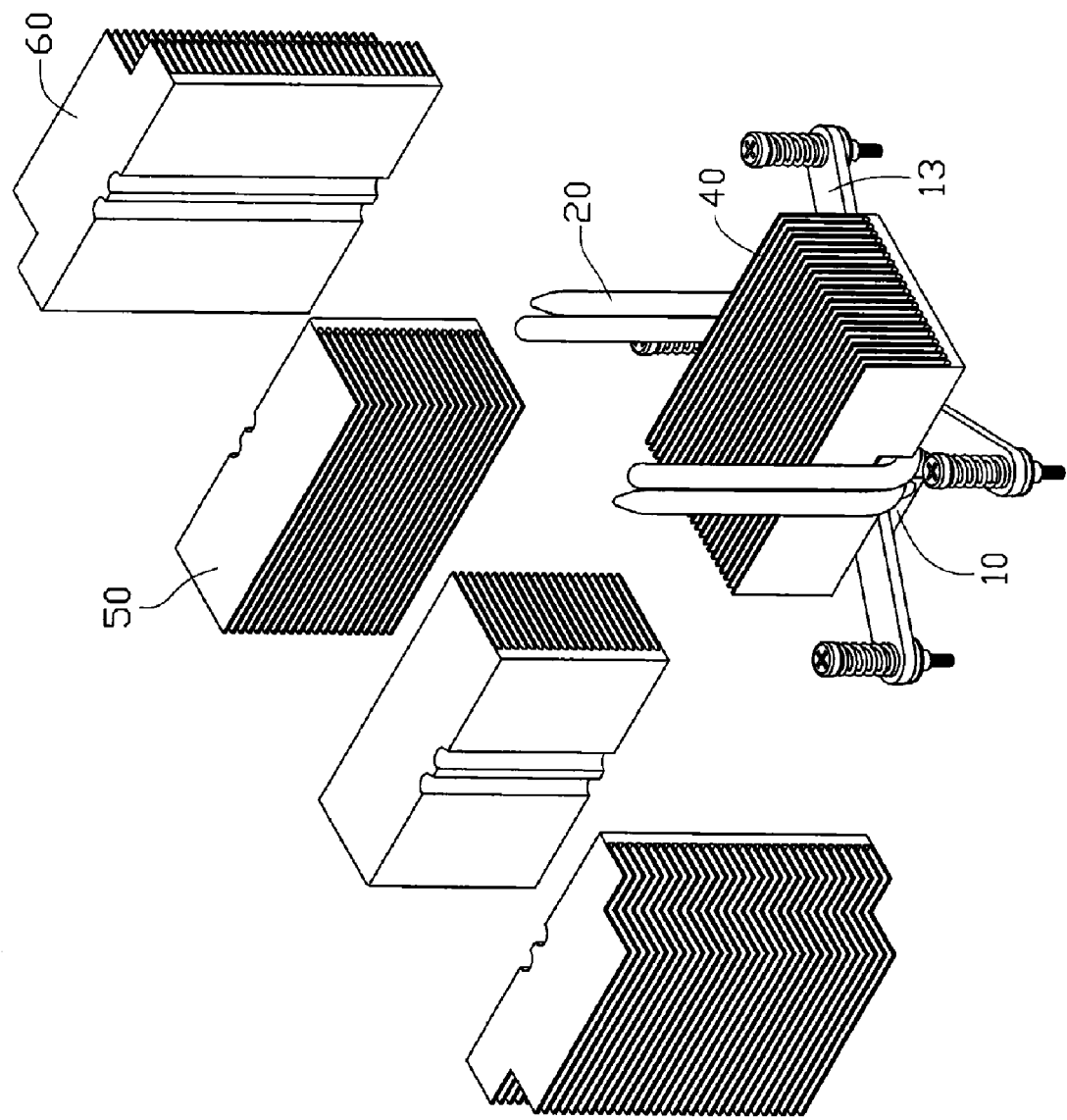
FIG. 3 is a further partially assembled view of FIG. 1.
Figure 4:
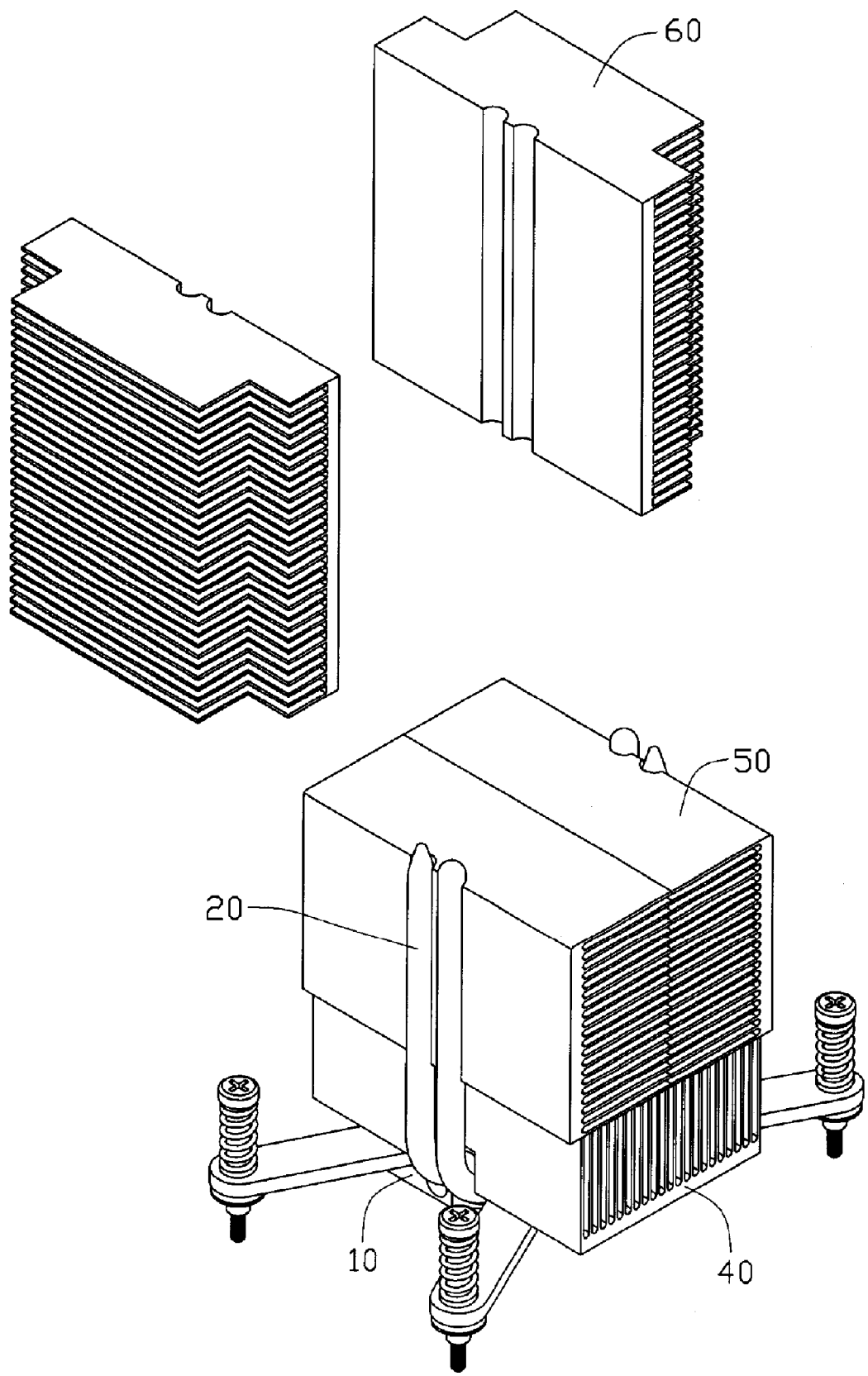
FIG. 4 is a still further partially assembled view of FIG. 1.
Figure 5:
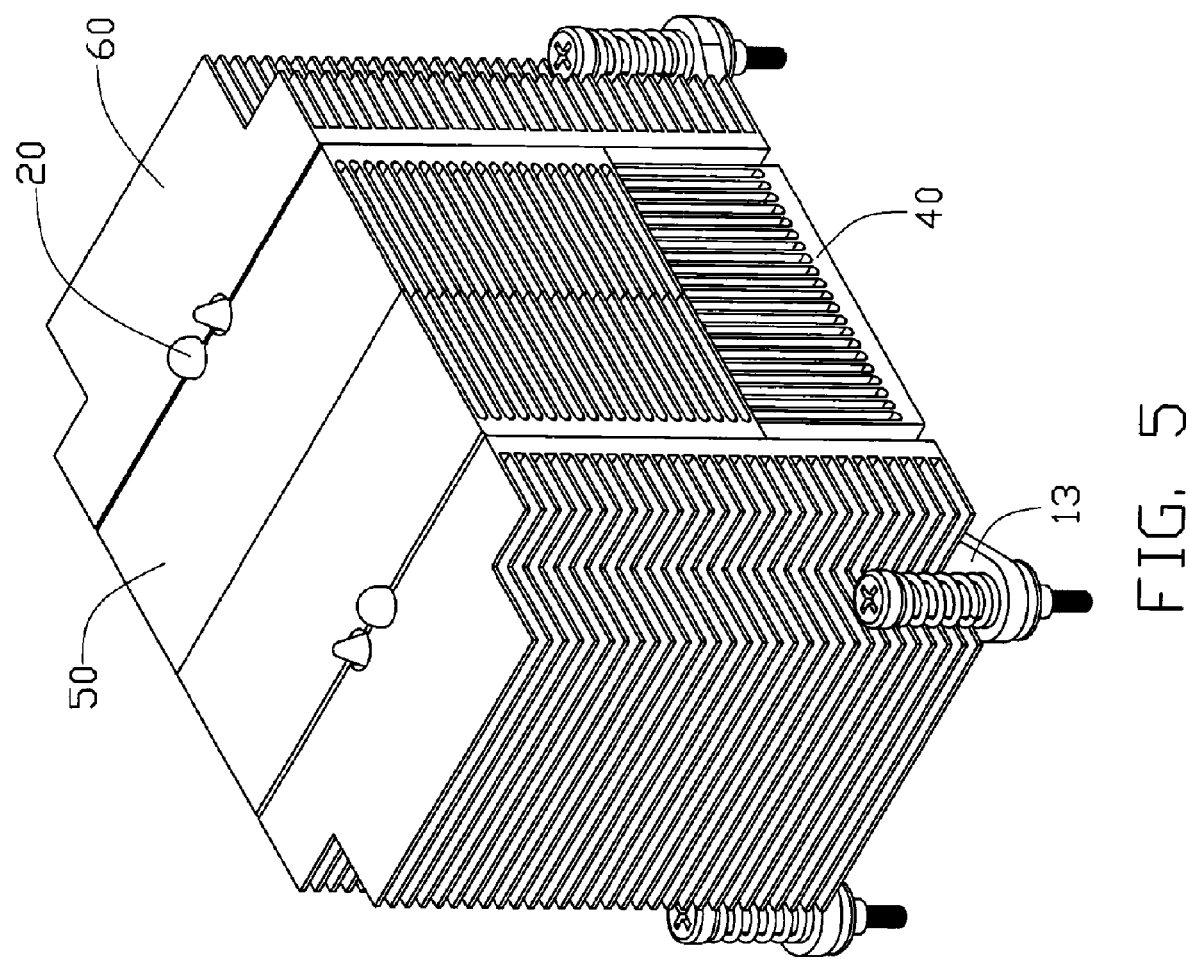
FIG. 5 is an assembled view of FIG. 1.

Referring also to FIGS. 3-5, the plurality of heat sinks comprises a first heat sink 40, two second heat sinks 50, and two third heat sinks 60. The first, second, third heat sinks 40, 50, 60 are all formed by aluminum extrusion. Aluminum extrusion is performed by forcibly pushing a one-piece stock of aluminum under a raised temperature through a mold. The first, second, third heat sinks 40, 50, 60 respectively comprise bases 410, 510, 610 and pluralities of fins 420, 520, 620 integrally extending perpendicularly from the bases 410, 510, 610, respectively. The base 410 of the first heat sink 40 has a bottom face contacting to the top plane of the seat 10. The second sections 202 of the two heat pipes 20 are positioned at two opposite sides of the first heat sink 40. Corresponding to the corners of the two heat pipes 20, the two opposite sides of the first heat sink 40 define two cutouts 411 therein, respectively, for eliminating interference with the two heat pipes 20. The second, third heat sinks 50, 60 respectively define two parallel grooves 511, 611 in non-fin faces of the bases 510, 610 thereof. The bases 510, 610 of the second and third heat sinks 50, 60 face to each other and thermally contact each other. The grooves 511, 611 corporately define two positioning channels (not labeled) between two thermally connected second and third heat sinks 50, 60. The second sections 202 of the two heat pipes 20 are fitted in the channels. The two second heat sinks 50 are sandwiched between the second sections 202 of the two heat pipes 20. The fins 520 of the second heat sinks 50 contact each other at distal ends thereof. The second heat sinks 50 have two bottom fins 520 contacting a top of the first heat sink 40. The two second heat sinks 50 are directly mounted on the first heat sink 40. The third heat sinks 60 are positioned at two opposite sides of the second heat sinks 50. The third heat sinks 60 have bottom ends thereof resting on the fixing arms 133 of the fixing members 13. Two slots (not labeled) are respectively defined between the two opposite sides of first heat sink 40 and the bases 610 of the third heat sinks 60. Thickness of the fins 520, 620 are substantial identical, and distances between two adjacent fins 520, 620 are also identical; thus, the fins 520, 620 of the second, third heat sinks 50, 60 align with each other at a horizontal direction. The fins 620 of the two third heat sinks 60 define four vertical spaces 621 corresponding to the fasteners 134 of the fixing members 13, for preventing interference between the fins 620 and the fasteners 134 to thereby facilitate an operator to manipulate the fasteners 134 to fix the heat dissipation device to the printed circuit board. The fins 420 of the first heat sink 40 extend vertically upwardly from the base 410 thereof. The fins 520 of the second heat sinks 50 extend from the bases 510 thereof in a direction horizontally towards each other. The fins 620 of the third heat sinks 60 extend from the bases 610 thereof in a direction horizontally away from each other.

In use, the first base plate 11 of the seat 10 contacts to the electronic device and absorbs heat therefrom. The heat in the first base plate 11 reaches the first sections 201 of the heat pipes 20, the second base plate 12 and the fixing members 13. And then the heat reaches the first, second, third heat sinks 40, 50, 60 via the second base plate 12, the fixing members 13 and the second sections 202 of the heat pipes 20. Subsequently, the heat is dissipated to ambient air by the fins 420, 520, 620.

According to the preferred embodiment of the present invention, the heat sinks 40, 50, 60 are combined with the heat pipes 20 to improve heat dissipation efficiency of the heat dissipation device. The heat sinks 40, 50, 60 of the heat dissipation device are formed by aluminum extrusion, which simplifies manufacture of the heat dissipation device and lowers cost of the heat dissipation device. Furthermore, the heat sinks 40, 50, 60 are combined to the heat pipes 20 via the heat pipes 20 being soldered in the grooves 511, 611 of the bases 510, 610 of the second, third heat sinks 50, 60, which is easy to realize an intimate and large contact between the heat sinks 50, 60 and the heat pipes 20; therefore, heat exchange between the heat pipes 20 and heat sinks 50, 60 is sufficient and rapid. Therefore, the heat dissipation capacity of the heat dissipation device is improved greatly.

In the present invention, it can be easily perceived by those skilled in the art that the two second sections 202 of each heat pipe 20 can be extended from the first section 201 thereof at angle larger than the shown 90, degrees. For such heat pipes, the second and third heat sinks 50, 60 are correspondently tilted in respective to the seat 10.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a seat for absorbing heat from a heat generating device;
   at least a heat pipe having a first section thereof thermally combined to the seat, and two second sections thereof extending remotely from the seat;
   a first heat sink having a base and a plurality of fins integrally extending from the base, the base being thermally combined to one of the two second sections of the at least a heat pipe, the base being perpendicular to the seat, the base and the fins being integrally formed from a one-piece stock;
   a second heat sink having a base and a plurality of fins integrally extending from the base of the second heat sink, wherein the base of the second heat sink is thermally combined to the foresaid one of the two second sections of the at least a heat pipe, the base and the fins of the second heat sink being integrally formed from a one-piece stock; and a third heat sink comprising a base and a plurality of fins integrally extending from the base, wherein the third heat sink is located between the two second sections of the at least a seat pipe and has the base thereof located close to the first section of the at least a heat pipe.

2. The heat dissipation device of claim 1, wherein the base of the second heat sink is perpendicular to the seat.

3. The heat dissipation device of claim 1, wherein the bases of the first and second heat sinks sandwich the foresaid one of the two second sections of the at least a heat pipe therebetween.

4. The heat dissipation device of claim 3, wherein the at least a heat pipe is generally U-shaped, the two second sections perpendicularly extending from two ends of the first section of the at least a heat pipe.

5. The heat dissipation device of claim 1, wherein the fins of the first and second heat sinks extend horizontally away from each other.

6. The heat dissipation device of claim 1, wherein the fins of the third heat sink extend vertically upwardly from to base thereof.

7. The heat dissipation device of claim 1 further comprising a fourth heat sink and a fifth heat sink sandwiching another of the two second sections of the at least a heat pipe therebetween.

8. The heat dissipation device of claim 7, wherein each of the fourth and fifth heat sinks comprises a plurality of fins the fins of the fourth and fifth heat sinks extend horizontally away from each other.

9. The heat dissipation device of claim 8, wherein the fins of the first and fourth heat sinks extend horizontally toward each other.

10. The heat dissipation device of claim 1, wherein the base of the first heat sink defines at least a groove therein receiving the aforesaid one of the two second sections of the at least a heat pipe therein.

11. The heat dissipation device of claim 1, wherein a plurality of fixing arms extend outwardly away the seat.

12. A heat dissipation device comprising:
a seat for absorbing heat from a heat generating device;
at least a heat pipe having a first section thereof thermally combined to the seat, and two second sections thereof extending from the first section and remotely from the seat;
a plurality of heat sinks each having a base and a plurality of fins integrally extending from the base, the bases of the heat sinks thermally sandwiching the two second sections of the at least a heat pipe therebetween, at least one of the bases being angled to the seat, each of the heat sinks having the fins and the base thereof formed from a one-piece stock; and
an additional heat sink located on the seat and between the two second sections of the at least a heat pipe.

13. The heat dissipation device of claim 12, wherein two heat sinks of the plurality of heat sinks are located at two opposite sides of the two second sections of the at least a heat pipe.

14. The beat dissipation device of claim 13, wherein two heat sinks of the plurality of heat sinks are sandwiched between the two second sections of the at least a heat pipe, the two heat sinks having the bases thereof thermally contacting the two second sections of the at least a heat pipe correspondingly.

15. The heat dissipation device of claim 12, wherein the additional heat sink is located under the plurality of heat sinks and thermally positioned on the seat.

16. A heat dissipation device comprising:
a seat for contacting with a heat-generating electronic component;
a plurality of fixing members extending outwardly from the seat, each fixing member being provided with a fastener thereon;
a heat pipe having an evaporating section thermally connected to the seat and a condensing section extending upwardly from the evaporating section;
a first heat sink mounted on the seat and having fins extending upwardly;
a second heat sink thermally connected to the second section of the heat pipe and having horizontally extending fins; and
a third heat sink thermally connected to the second section of the heat pipe and having horizontally extending fins, the fins of second and third heat sinks extending away from each other; wherein the first, second and third heat sinks are made of aluminum extrusion;
wherein the second heat sink sits on the first heat sink;
wherein the third heat sink sits on at least one of the fixing members.

17. The heat dissipation device of claim 16, wherein the first heat sink defines a cutout in a bottom thereof for accommodating a joining corner between the evaporating section and the condensing section of the heat pipe.

* * * * *